(12) United States Patent
Schriesheim et al.

(10) Patent No.: US 10,664,628 B2
(45) Date of Patent: May 26, 2020

(54) INTERACTIVE SURFACE ALIGNMENT

(71) Applicant: Dassault Systemes SolidWorks Corporation, Waltham, MA (US)

(72) Inventors: Benjamin H. Schriesheim, Somerville, MA (US); Salvatore F. Lama, Bolton, MA (US); Xavier Benveniste, Arlington, MA (US)

(73) Assignee: DASSAULT SYSTEMES SOLIDWORKS CORPORATION, Waltham, MA (US)

( * ) Notice: Subject to any disclaimer, the term of this patent is extended or adjusted under 35 U.S.C. 154(b) by 976 days.

(21) Appl. No.: 14/563,357

(22) Filed: Dec. 8, 2014

(65) Prior Publication Data
US 2016/0162603 A1    Jun. 9, 2016

(51) Int. Cl.
*G06F 30/00*    (2020.01)

(52) U.S. Cl.
CPC .................................. *G06F 30/00* (2020.01)

(58) Field of Classification Search
CPC ....................................................... G06F 17/50
See application file for complete search history.

(56) References Cited

U.S. PATENT DOCUMENTS

| | | | | |
|---|---|---|---|---|
| 5,701,403 | A   * | 12/1997 | Watanabe | G06T 17/10 345/419 |
| 6,639,592 | B1   | 10/2003 | Dayanand et al. | |
| 7,830,377 | B1 * | 11/2010 | Desimone | G06F 17/50 345/419 |
| 8,836,701 | B1 * | 9/2014  | Rockwood | G06F 17/50 345/419 |
| 9,607,422 | B1 * | 3/2017  | Leedom | G06T 15/00 |
| 2011/0285696 | A1 * | 11/2011 | Ocali | G06T 1/00 345/419 |
| 2013/0124149 | A1 * | 5/2013  | Carr | G06F 17/50 703/1 |
| 2013/0293541 | A1 * | 11/2013 | Maisonneuve | G06T 17/205 345/420 |

* cited by examiner

*Primary Examiner* — Brian W Wathen
*Assistant Examiner* — Carina Yun
(74) *Attorney, Agent, or Firm* — Hamilton, Brook, Smith & Reynolds, P.C.

(57) ABSTRACT

A computer-implemented method and system modifies a pre-existing surface. The invention method/product/data storage medium/system generates an outline of a shape of an object, which is a curve. A reference surface is then created by extruding the curve. Selected entities of the pre-existing surface are projected to a location on the reference surface, after which the pre-existing surface is regenerated using the location for each entity to calculate a modified pre-existing surface.

18 Claims, 10 Drawing Sheets

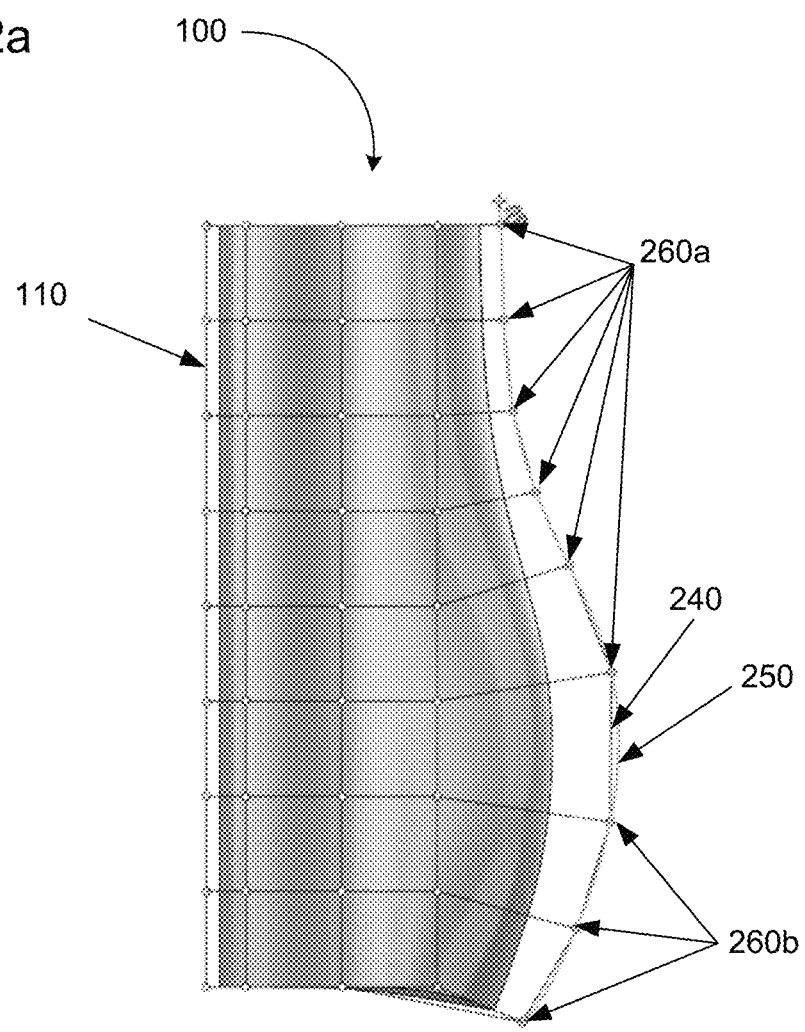

INTERACTIVE SURFACE ALIGNMENT

BACKGROUND OF THE INVENTION

Computer-aided design (CAD) software allows a user to construct and manipulate complex three-dimensional (3D) models. A number of different modeling techniques can be used to create a 3D model. One such technique is a surface modeling technique in which surface definitions define a model. Another modeling technique is a solid modeling technique, which provides for topological 3D models where the 3D model is a collection of interconnected topological entities (e.g., vertices, edges, and faces). The topological entities have corresponding supporting geometrical entities (e.g., points, trimmed curves, and trimmed surfaces). The trimmed surfaces correspond to the topological faces bounded by edges. Hereinafter, the terms vertex, edge, and face will be used interchangeably with their respective, corresponding geometric entities. CAD systems may combine solid modeling and other modeling techniques, such as parametric modeling techniques. Parametric modeling techniques can be used to define various parameters for different features and components of a model, and to define relationships between those features and components based on relationships between the various parameters.

A design engineer is a typical user of a 3D CAD system. The design engineer designs physical and aesthetic aspects of 3D models, and is skilled in 3D modeling techniques. One feature of many commercially available 3D CAD systems enables a design engineer to create a 3D CAD model by constructing one or more surfaces and then modifying the surfaces to achieve a desired shape of the 3D model or portion thereof. Several techniques have been implemented by current state of the art 3D CAD systems to construct and modify surface models. For example, U.S. Pat. No. 6,639,592 to Dayanand et al discloses using multiple curves to create a surface, where each curve has a specified amount of influence (i.e., small, medium, and large amount of influence) on the shape of the resulting surface. Other examples are the sub-divisional modeling approach where the user individually moves vertices of an underlying cage to influence the shape of a resulting surface, and lofting techniques to create surfaces from curves. Yet another example is an approach implemented in SolidWorks® 2012, which modifies faces of surface and solid bodies by enabling a user to create control curves and control points on a surface and manipulate those control curves and control points to modify a face, thereby giving the user direct, interactive control of deforming a model.

In many CAD systems, curves and surfaces are generally represented as analytical or spline curves and surfaces (e.g., Bezier curves and surfaces), and in particular as non-uniform rational b-spline (NURBS) curves and surfaces. Additionally, some CAD systems utilize tessellated models whereby the surfaces of a model are faceted by sub-dividing each surface into triangular or other polygonal shapes; hereinafter such a surface shall be referred to as a subdivision surface. Subdivision surfaces may be used to define solid and surface models.

Current approaches to modifying a surface include changing the location of one or more control points that may or may not pass through the surface, after which the surface is recalculated using the control points' new locations as input to the surface calculation. Some approaches enable only one control point to be modified at a time, for example, by interactively pulling the point in one direction or another (e.g., using a cursor-controlled device or touch-screen technology), after which the surface is recalculated. If the design engineer is not satisfied with the shape of the recalculated surface, the control point or another control point is repositioned and then the surface is recalculated once again. This iterative process may be time-consuming and cumbersome. Other approaches allow one or more faces or edges of a solid model to be moved together after a group selection of those faces or edges, which may also require an iterative process that is time-consuming and cumbersome. (The one or more faces may correspond to an entire surface or one or more subdivisions of a surface.)

Procedures for creating and modifying surfaces may be tedious and not intuitive. For example, control points may have assigned weights that determine the influence of the position of each respective control point on a curve or surface, and thereby, the shape of the curve or surface does not exactly align to the control points. Thus, the design engineer may visualize a shape of an object; however, to create that shape in a CAD system may require numerous steps to specify the shape in a piecemeal fashion, an intuitively opposite approach because a surface is iteratively modified until the desired shape is achieved rather than creating the desired shape first and having the surface created to align to the shape.

Currently available technologies fall short of solutions to the problem of moving one control point or group of control points at a time to achieve a pre-conceived shape. Methods later to be described herein solve this problem and allow for time-saving advantages and enhancements to current CAD systems.

SUMMARY OF THE INVENTION

In general, in one aspect, embodiments of the invention feature a computer-implemented method of modifying a pre-existing surface. The method includes generating an outline of a shape of an object on a computer screen, where the outline is a curve, creating a reference surface by extruding the curve, selecting entities that define the pre-existing surface, projecting the entities from the pre-existing surface to a projected location on the reference surface, and regenerating the pre-existing surface using the projected location for each entity to calculate a modified pre-existing surface.

If the curve is a straight line, the reference surface is a plane. And, if the curve is a multi-segment curve the reference surface is a curved surface. Extruding the curve extrudes the curve a positive and/or a negative viewing direction.

The outline of the shape is generated on a virtual plane normal to a viewing direction. The outline may be generated from a user input of a desired shape of an object, or an automatic response to user interaction with a user interface.

The pre-existing surface may be a subdivision surface, and the selected entities may be a face, an edge, and/or a vertex. Additionally, the portion of the pre-existing surface may be changed interactively by excluding entities from being projected onto the reference plane and including additional entities to project onto the reference plane. A user interface handle and interactive selection of one or more entities may be employed to change the scope of the pre-existing surface influenced by the reference plane.

Furthermore, the entities may be projected such that the respective projected entities on the reference surface are equidistant along the reference surface, positioned on a vector normal to the pre-existing surface, positioned on a vector normal to the reference surface, located closest to a respective entity, and positioned to maintain the same relative spacing as the entities on the pre-existing surface.

Other embodiments include a computer-aided design (CAD) system having a processor operatively coupled to a data storage system and a data storage memory operatively coupled to the processor. In such embodiments, the data storage memory includes instructions to configure the processor draw a curve representing an outline of a shape of an object, extrude the curve to create a reference surface, select a portion of a pre-existing surface by selecting one or more entities that define the pre-existing surface, map each of the selected entities to a respective location on the reference surface, and regenerate the pre-existing surface using each of the respective locations for each selected entity to calculate a modified pre-existing surface.

Yet other embodiments include a non-transitory computer-readable data storage medium containing instructions for draw a curve representing an outline of a shape of an object, extrude the curve to create a reference surface, select a portion of a pre-existing surface by selecting one or more entities that define the pre-existing surface, map each of the selected entities to a respective location on the reference surface, and regenerate the pre-existing surface using each of the respective locations for each selected entity to calculate a modified pre-existing surface.

Other aspects of the invention include drawing the curve on a virtual plane normal to a viewing direction, creating the reference surface by extruding the curve in a positive and/or a negative viewing direction, generating the curve from user input of a desired shape of an object or as an automatic response to user interaction with a user interface, the pre-existing surface being a subdivision surface, and the selected entities aiding in the calculation of the subdivision surface.

Additionally, aspects of the invention include at least one of the sides and the corners of the reference surface can be interactively manipulated causing a modification in the pre-existing surface; the modification results from remapping the selected entities onto the reference surface.

Further aspects of the invention include if the curve is a straight line, the reference surface is a plane, and if the curve is a multi-segment curve, the reference surface is a curved surface. Still other aspects of the present invention include performing a projection that creates respective entities on the reference surface that are equidistant along the reference surface, positioned on a vector normal to the pre-existing surface, positioned on a vector normal to the reference surface, positioned closest from a respective entity of the pre-existing surface, and that are the same relative spacing as the entities on the pre-existing surface.

The details of one or more embodiments of the invention are set forth in the accompanying drawings and the description that follows. Other features, objects, and advantages of the invention will be apparent from the description and drawings, and from the claims.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIG. 1b is an illustration of an orthogonal view of the subdivision surface and the mesh in FIG. 1a.

FIG. 2a is an illustration of a deformation to the subdivision surface and the mesh of FIGS. 1a and 1b.

DETAILED DESCRIPTION OF THE INVENTION

As previously described, design engineers may need to create and modify surfaces that define an object using a three-dimensional (3D) computer-aided design (CAD) system. Often CAD users can only modify surfaces in a piecemeal fashion because intuitive software tools for surface design are not available. By enabling a design engineer to draw a desired shape of an object, and in response, automatically modifying a 3D surface that conforms to the drawn desired shape, the present invention alleviates the necessity of performing repetitive, incremental surface modifications via an excessive amount of piecemeal adjustments to one or more entities on or that influence a surface until a final desired shape is achieved. After the design engineer draws the desired shape (e.g., in freehand using a pointing device such as a mouse or a stylus, or touchscreen technology), the present invention generates a smoothed curve from the desired shape and a reference surface from the smoothed curve, and automatically calculates a surface using points on the smoothed curve and/or the reference surface to define the shape of the object. No piecemeal manipulation of control points or other curve or surface entities is necessary to revise the shape the object. Additionally, the design engineer may refine the shape of the surface until the desired shape is achieved by re-drawing a refined desired shape of the surface multiple times.

Thus, the present invention enables a design engineer to envision an overall shape of an object by visualizing and drawing a profile of a corresponding surface, which is converted first into a smoothed curve then a 3D reference surface. To modify the shape of the object, another profile is drawn to which selected points on the object automatically map, and thereby, the underlying surface is redefined.

Figure 1A:
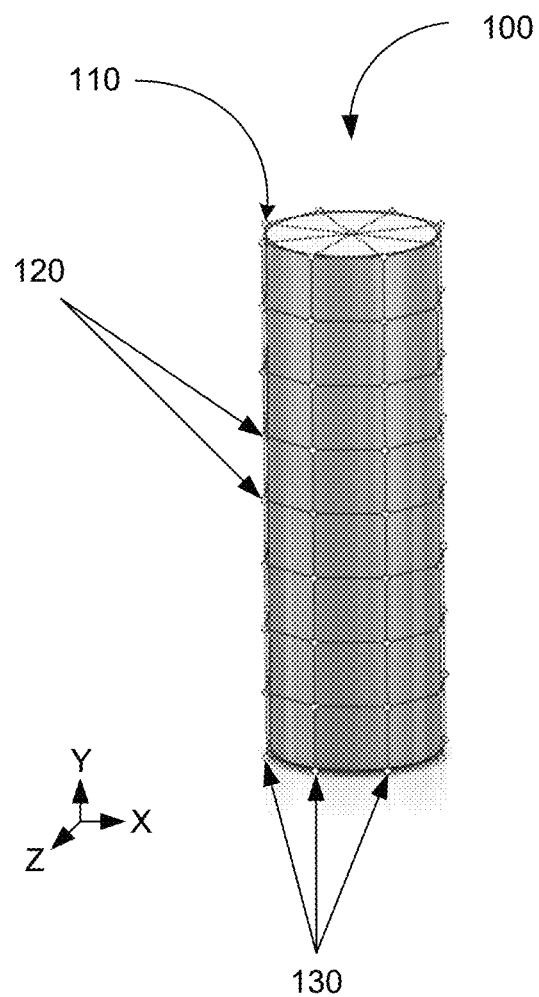
FIG. 1a is an illustration of a view of a subdivision surface and a mesh.
Figure 1B:
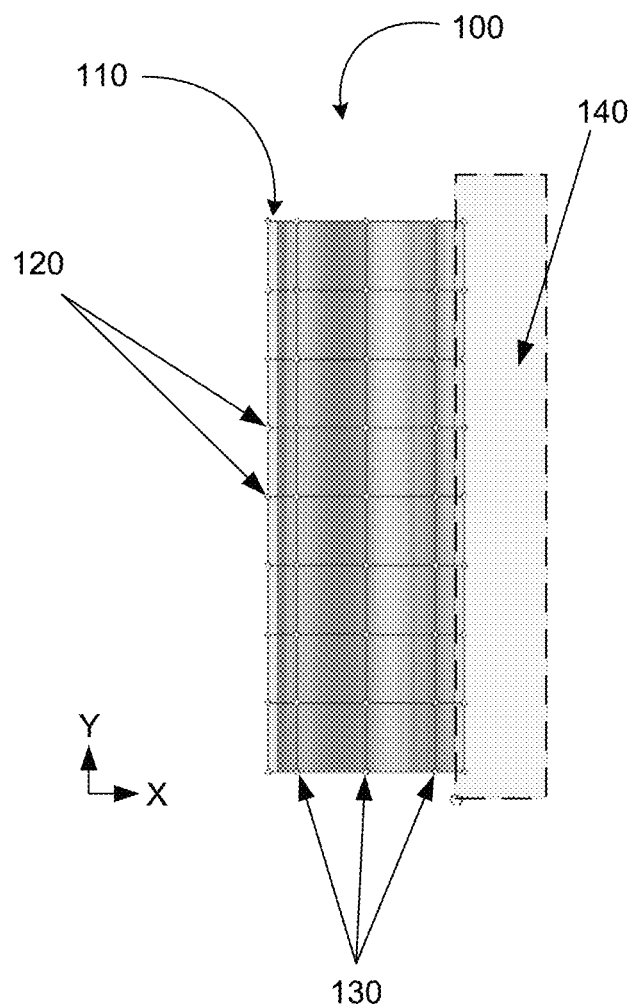

Referring now to FIGS. 1a and 1b, an interactive solution for aligning a surface according to an embodiment of the present invention is shown. FIGS. 1a and 1b illustrate a subdivision surface 100 inside a cage-like mesh structure 110. The shape of the subdivision surface 100 is determined by the shape of the mesh 110, which in turn is determined by the location of mesh vertices, such as mesh vertices 120 and 130. FIG. 1a shows a view of the subdivision surface 100 and the mesh 110 rotated somewhat about the x-axis; whereas FIG. 1b shows an orthogonal view of the subdivision surface 100 and the mesh 110.

Additionally, FIG. 1b shows a number of vertices in a box select area 140, indicated in FIG. 1b by an area bounded by dashed lines. The vertices in the box select area 140 may have been chosen via a group selection operation such as a box select function. Other group selection methods include a lasso selection, a selection of a loop of connected edges, and a selection of a ring of parallel edges of a mesh). In this example embodiment, the selected vertices (i.e., the vertices in the box select area 140), will all be transformed in a positive or a negative x-direction to a position on a smoothed curve 250, as shown in FIG. 2a.

FIG. 2a illustrates the subdivision surface 100, the mesh 110, a coarse curve 240, and the smoothed curve 250. In this example embodiment, the coarse curve 240 was drawn freehand (e.g., with a pen stroke) by the user and then smoothed to create the smoothed curve 250. Smoothing may be accomplished using standard smoothing methods, such as a least square smoothing method. After selected vertices 260a, 260b (i.e., those vertices initially in box select area 140) have been established and the smoothed curve 250 generated, which may occur in any order, the selected vertices 260a, 260b are mapped to the smoothed curve 250. The mesh 110 is then regenerated using the new positions of the selected vertices, a modified subdivision surface 100 is calculated from the regenerated mesh 110, and both the modified subdivision surface 100 and the mesh 110 are output to the display screen as illustrated in 2a.

Figure 2B:
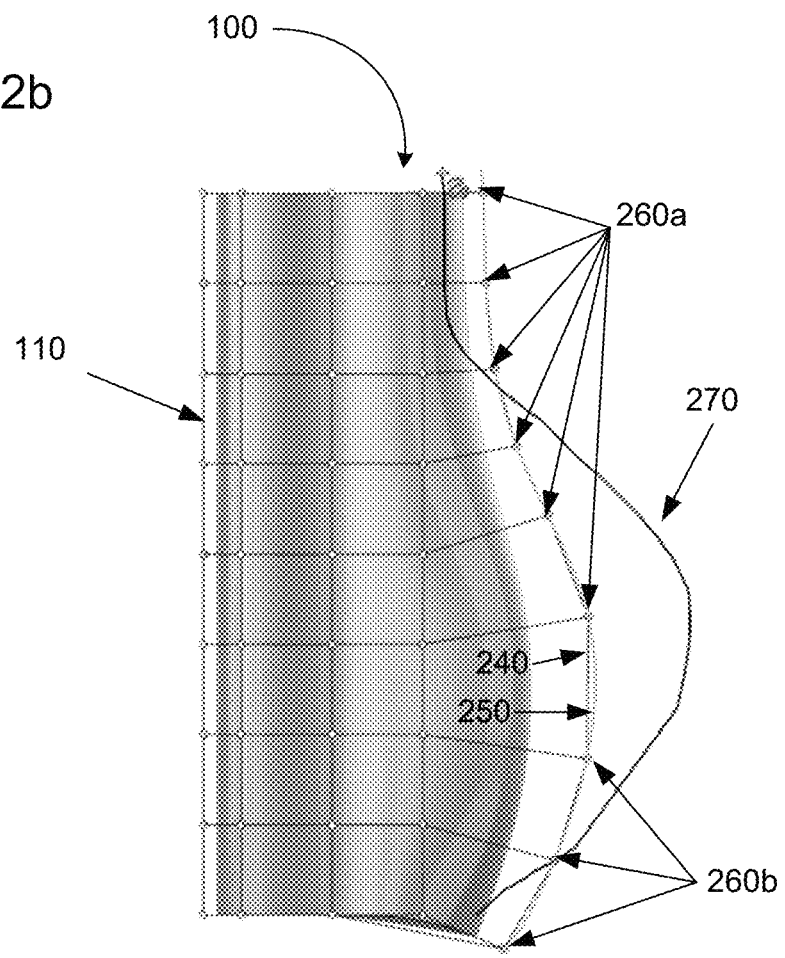
FIG. 2b is an illustration of a deformation to the subdivision surface and the mesh of FIG. 2a, and two curves.
Figure 2C:
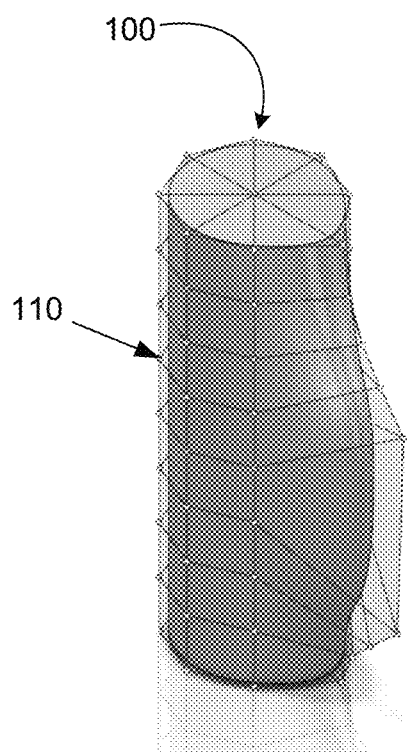
FIGS. 2c and 2d are illustrations of two different types of depictions of a subdivision surface and a mesh.
Figure 2D:
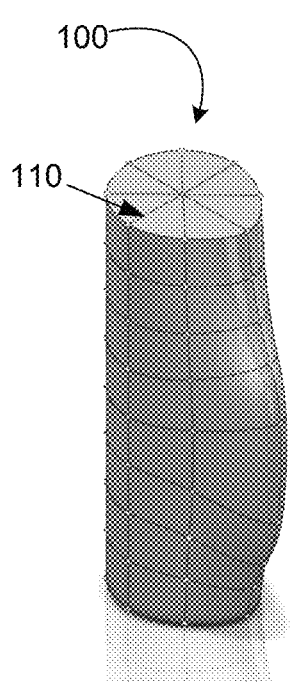

FIG. 2b illustrates a second coarse curve 270. The second coarse curve 270 is drawn to refine the shape of the mesh 110, and thereby, refine the subdivision surface 100. As similarly described with reference to FIG. 2a, the present invention smooths the second coarse curve 270 and maps the selected vertices 260a, 260b to the smoothed coarse curve. Mapping the selected vertices 260a, 260b to the smoothed coarse curve changes the mathematical representation of the mesh 110, from which a modified subdivision surface 100 is calculated, as shown in FIG. 2c and FIG. 2d. In FIG. 2c, the mesh 110 is a true depiction of the underlying mathematical representation; whereas, in FIG. 2d, the mesh 110 is projected onto the modified subdivision surface 100 for aesthetic purposes. Implementations of the present invention can map the underlying mathematical representation of the mesh 110 and the modified subdivision surface 100 to the smoothed curve. To map the modifies subdivision surface 100 to the smoothed curve, the present invention calculates the distance from the smoothed curve that each vertex needs to be located respectively, to align the modified subdivision surface 100 to the smoothed curve.

As discussed, a mapping occurs between selected mesh vertices and a smoothed curve derived from a user's freehand drawing. Such mapping may be achieved by projecting vectors normal from the mesh at the location of each respective selected vertex toward the smoothed curve. The present invention also embodies other types of mappings. For example, the vectors may be projected to points on the smoothed curve that are the closest distance to a respective selected vertex, or to a point on the smoothed curve such that the direction from the point to the vertex is perpendicular to the smoothed curve. Additionally, a mapping may maintain the same proportional distance between the points on the smoothed curve as the proportional distance between the respective selected vertices prior to the mapping.

In the examples heretofore discussed, the selected vertices were the furthest right vertices depicted in FIGS. 1a, 1b, 2a, 2b, 2c, and 2d and no other vertices were positioned behind those selected vertices. Thus, describing a mapping to a smoothed curve simplifies the teachings discussed herein with reference to FIGS. 1a, 1b, 2a, 2b, 2c, and 2d. However, if another set of vertices was selected, additional vertices may be positioned behind the selected vertices. The present invention also maps these additional vertices, but not to the same smoothed curve; rather, the additional vertices are mapped to a reference surface created by extruding the smoothed curve. Visually, the mapping operation may cause the vertices to appear to snap to the reference surface.

Figure 3A:
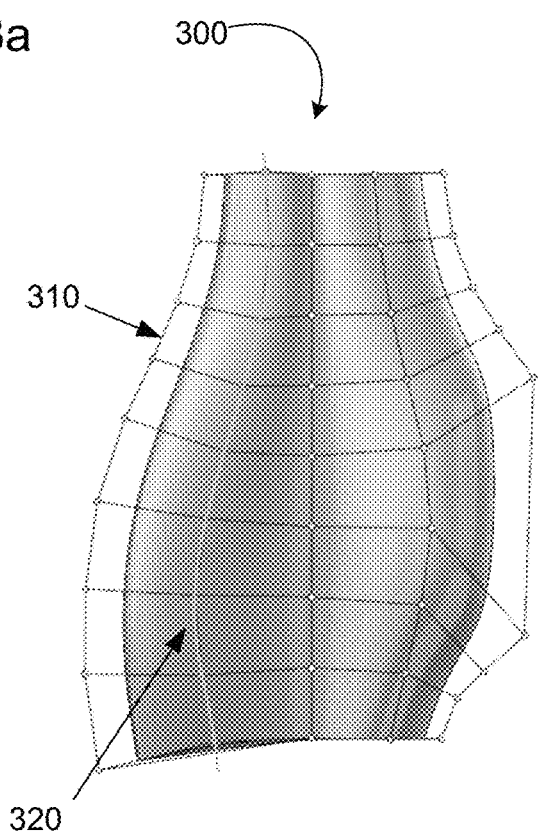
FIG. 3a is an illustration of a subdivision surface, a mesh, and a smoothed curve, according to an example embodiment of the present invention.
Figure 3B:
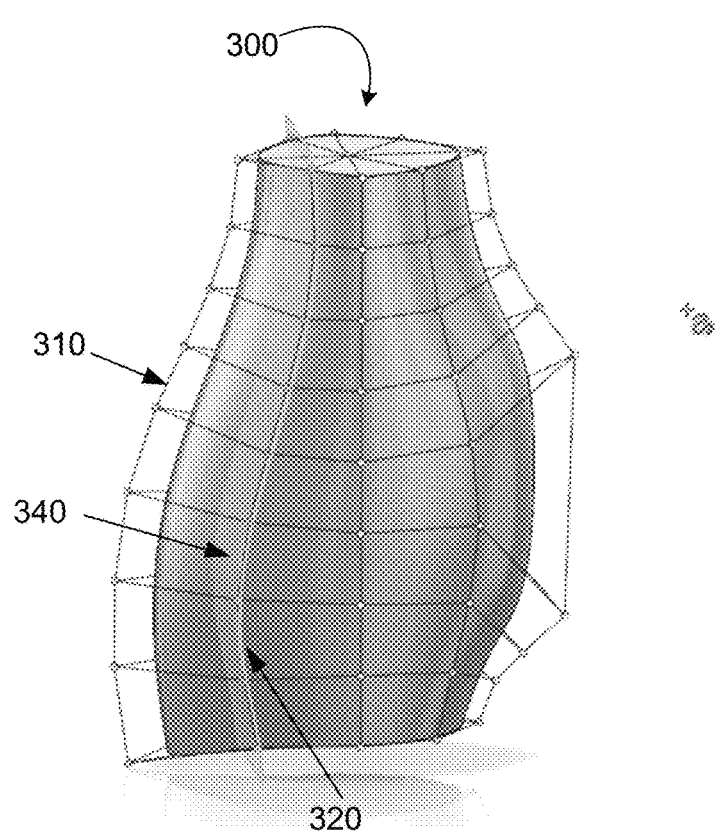
FIG. 3b is an illustration of the subdivision surface, the mesh, and the smoothed curve of FIG. 3a, and a reference surface, according to an example embodiment of the present invention.

Referring now to FIGS. 3a and 3b, a view of a regenerated subdivision surface 300 and a mesh 310 is shown. A smoothed curve 320 is drawn on the regenerated subdivision surface 300. The smoothed curve 320 was derived from a user's freehand drawing, as has been discussed. Selected vertices in this example appear on the smoothed curve. Additional selected vertices exist, however. On the non-visible side of the mesh, are mesh vertices that were also selected by virtue that each of these mesh vertices have the same X and Y coordinates (i.e., share the same horizontal and vertical values) as at least one of the visible selected vertices. (As previously discussed, a loop of connected edges and a ring of parallel edges around a mesh may be selected via a group selection command.) The present invention extrudes the smoothed curve 320 to create a reference surface 340. The reference surface 340 extends through the entire mesh 310. Instead of a mapping to a smoothed curve, the selected vertices on the mesh map to the reference surface 340. Because the reference surface 340 extends through the subdivision surface 300, the mapping operation will result in a reduced subdivision surface 300.

Figure 4A:
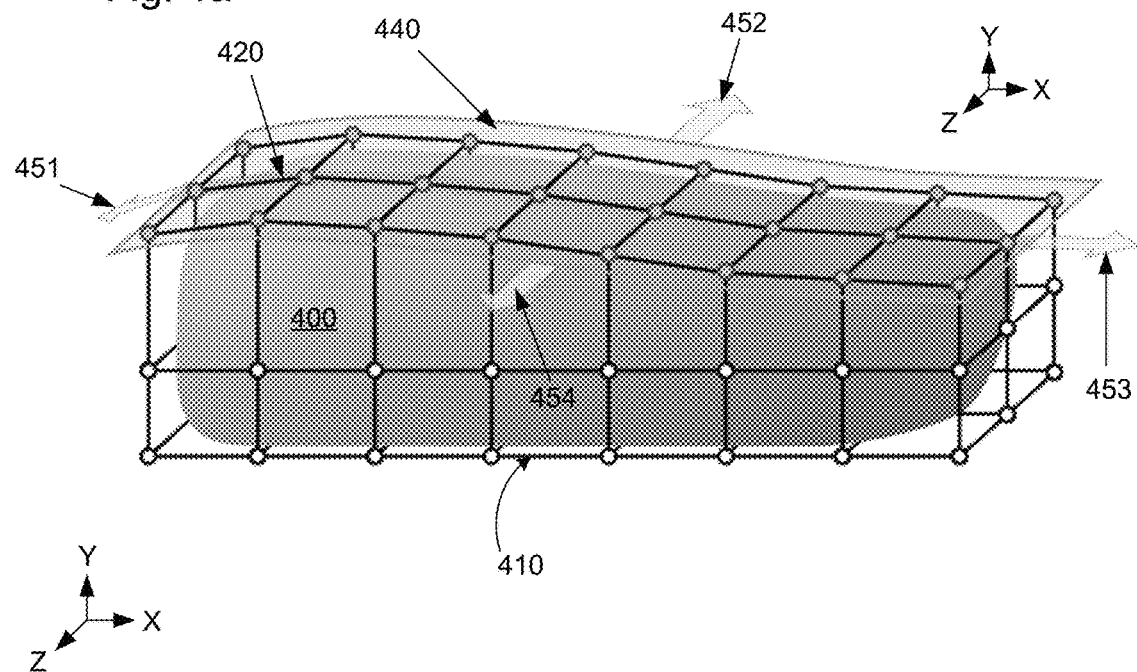
FIGS. 4a and 4b are illustrations of a subdivision surface, a mesh, and a change in scope of a reference surface according to an example embodiment of the present invention.

Referring now to FIG. 4a, another illustration of a reference surface created from a smoothed curve is shown. A model 400 is formed from a mesh 410. A smoothed curve 420 was created from a freehand drawing. The smoothed curve 420 was then extruded in the positive and negative z-directions (i.e., toward and away from the viewing direction), such that the size of the extruded curve extends to or beyond the furthest vertices in the positive and negative z-directions. In FIG. 4a, selected vertices have been mapped to the extruded curve, which is reference surface 440.

Figure 4B:
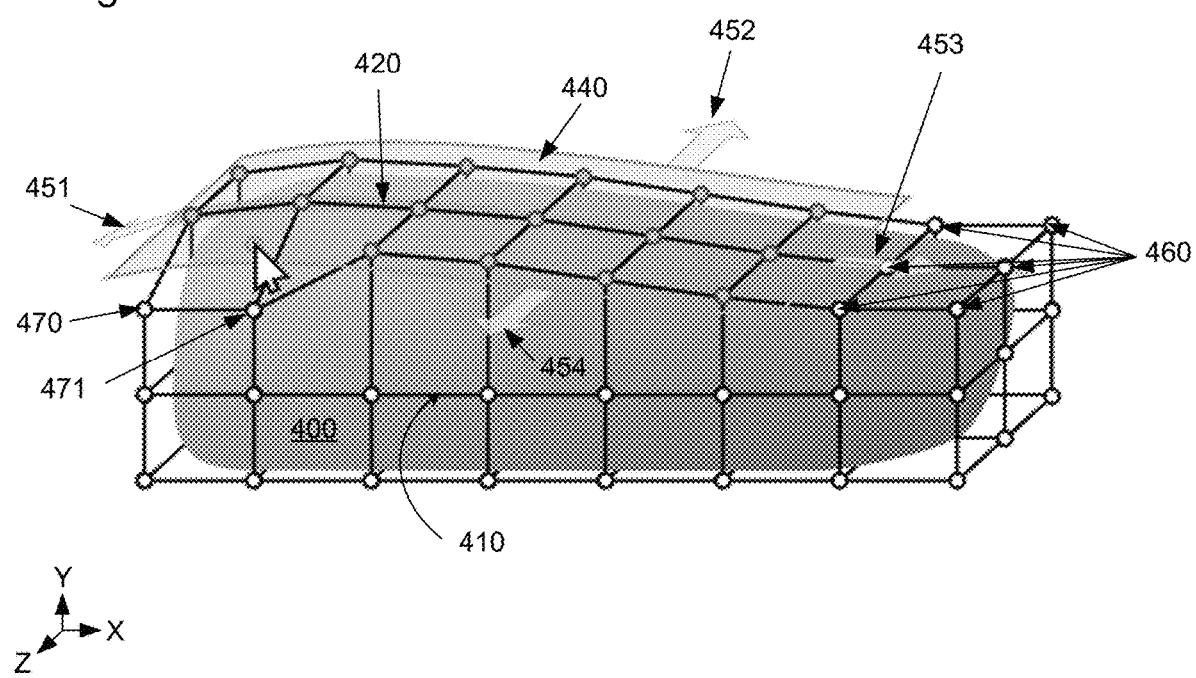

FIG. 4b illustrates the reference surface 440 created by extruding the smoothed curve 420 in the positive and negative z-directions. Additionally, arrows 451, 452, 453, and 454 emanate from the sides of the reference surface 440. Arrows 451-454 are user interface (UI) handles used to manipulate the size of the reference surface 440, which affects the scope of the mapping. For example, FIG. 4b illustrates the reference surface 440 not extending as far in the positive x-direction as is shown in FIG. 4a. As illustrated, the reference surface 440 is reduced in the positive x-direction because the arrow 453 was pushed in the negative x-direction. As a result, the points 460 will no longer be affected by a change in the reference surface 440.

De-selecting and selecting individual vertices also change the scope of the set of vertices that map to the reference surface 440. Again, referring to FIG. 4*b*, point 470 and point 471 have been de-selected and therefore are not influenced by the reference surface 450.

Embodiments heretofore discussed have described the drawing to which a surface of a model aligns as a multi-segment curve. However, a user may wish to align a surface to a plane. In an embodiment of the present invention, the user may draw a straight line or initiate a command that creates a straight line or planar surface automatically via a UI menu or an icon selection. Once the straight line is positioned as desired by the user, an extrude operation is applied to the straight line and thereby creates a plane. The present invention then aligns the surface of the model to the plane by projecting a set of vertices selected from the surface of the model onto the plane and recalculating the surface using the new positions of the selected vertices.

Figure 5A:
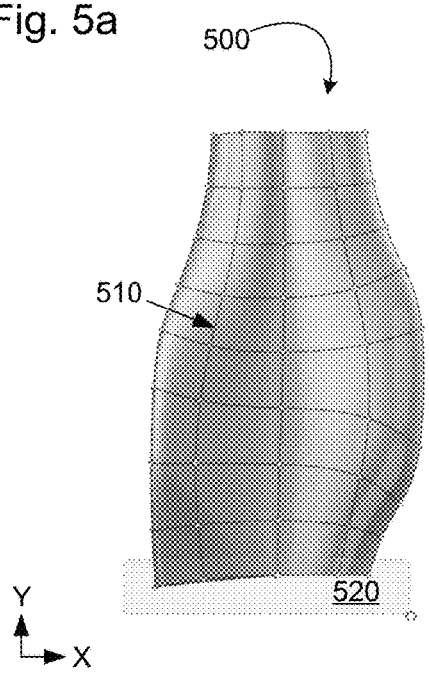
FIG. 5a is an illustration of a subdivision surface, a mesh, and a selected vertices, according to an example embodiment of the present invention.

Referring now to FIG. 5*a*, the lower boundary of model 500 is curved. However, a user may desire the lower boundary to be planar. To make the lower boundary planar, a set of vertices is selected and a plane is created to which the selected vertices align. Shown in FIG. 5*a* is a box select area 520 encompassing the lower vertices of a subdivision surface 510. As has been described, the present invention also selects all vertices that have x- and y-coordinates within the box select area 520, albeit on different planes in the z-direction.

Figure 5B:
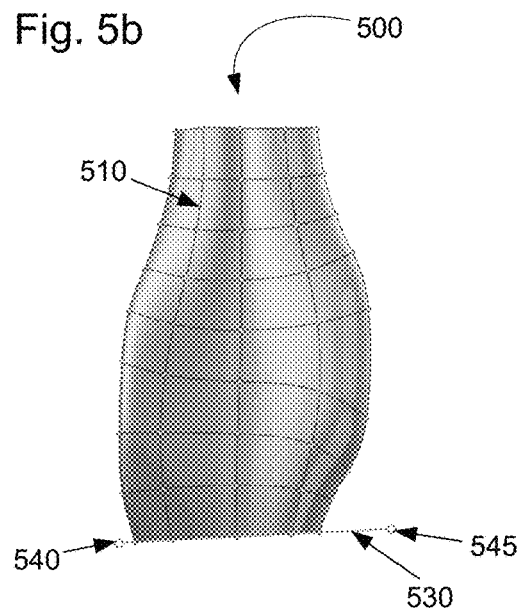
FIG. 5b is an illustration of the subdivision surface and the mesh of FIG. 5a, and a reference plane, according to an example embodiment of the present invention.
Figure 5C:
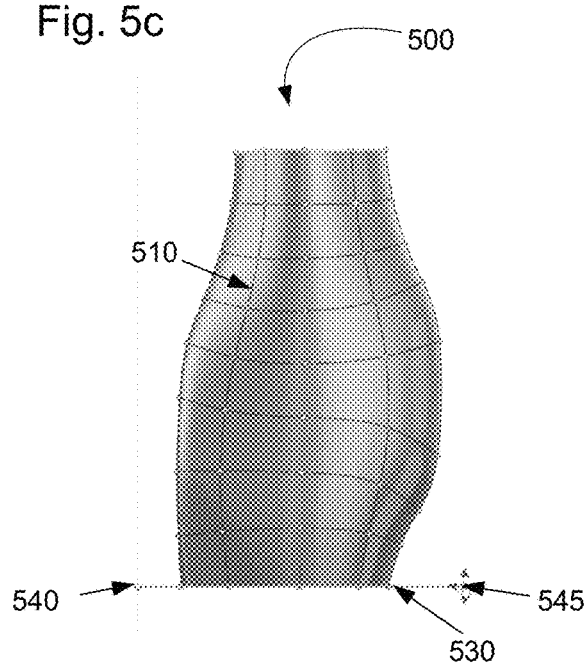
FIG. 5c is an illustration of the subdivision surface, the mesh, a straight line, and the reference plane of FIG. 5b, according to an example embodiment of the present invention.

Referring now to FIG. 5*b*, a plane 530 is created. The plane 530 is defined by extruding the line in the positive and/or negative viewing direction, as has been discussed. The selected vertices are then mapped to the plane 530. Mapping may be accomplished by projecting the selected vertices outward from and along vectors normal to the mesh, outward from the mesh and along vectors normal to the reference surface (i.e., plane 530 in FIGS. 5*b* and 5*c*), or such that relative spacing between the initial and projected locations of the selected vertices is maintained. The present invention enables the user to modify the angle of the reference surface by placing user interface handles on the corners of the reference surface. Such handles are shown in FIGS. 5*b* and 5*c* as handle 540 and handle 545. The user may then move the handles 540, 545 of the plane 530 to adjust the angle of the plane 530 with respect to the model 500 and the subdivision surface 510. As one or more of the handles 540, 545 change the angle of the plane 530, the selected vertices are projected onto the new orientation of the plane, the subdivision surface 510 is recalculated using the new positions of the selected vertices, and the model 500 is regenerated accordingly.

Implementations of the present invention also allow the user to create a warped surface by dragging one or more of the four corners of the reference surface, rotating the reference surface in a direction, and dragging the bounding edges of the reference surface to give the reference surface curvature in the two directions.

Figure 6:
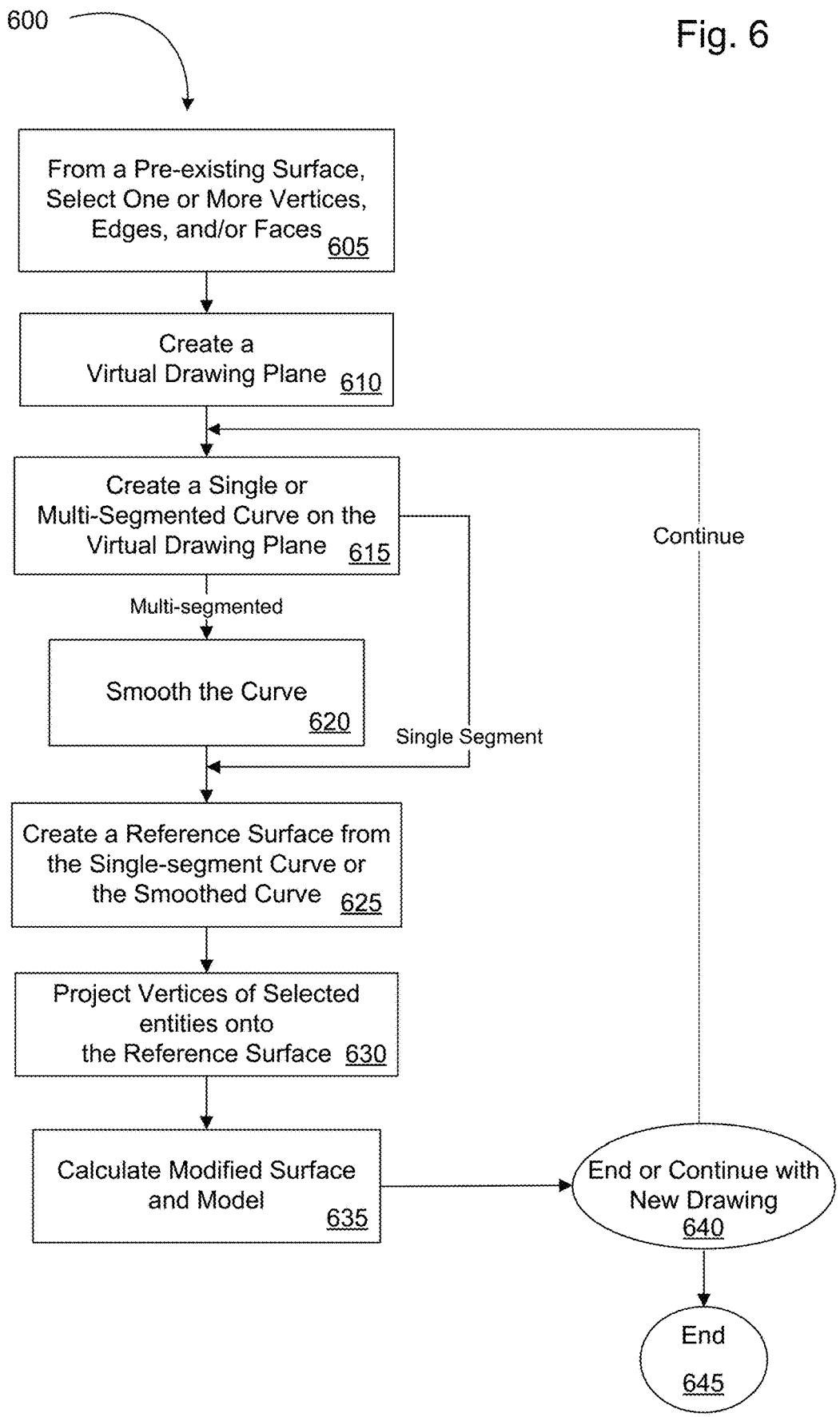
FIG. 6 is a flow diagram containing steps for modifying a subdivision surface, according to an example embodiment of the present invention.

Referring now to FIG. 6, a process 600 for modifying a surface is shown, according to an example embodiment of the present invention. The surface is defined by a mesh and is part of a CAD model. To begin process 600, vertices, edges, faces, or a combination thereof are selected (step 605). Such vertices, edges, faces, or combination thereof will hereinafter be referred to as pre-selected entities. The pre-selected entities may be selected individually or via a box select function such that a first then a second point in space are selected and specify two diagonally opposite corners of an area in which all entities within that area are automatically selected. Other group select methods may also be used, as has been discussed.

In the next step, a virtual drawing plane is created (step 610). The virtual drawing plane is a two-dimensional (2D) plane in 3D space, and in one embodiment of the present invention, is normal to the viewing direction. The distance of the virtual drawing plane from the viewpoint is with respect to the position of the model and the mesh from the viewpoint. The virtual drawing plane may be positioned to intersect the subdivision surface at the mathematical mean of all z-values of all model entities. Alternatively, the virtual drawing plane may be placed on a plane defined by z=max (model z-value) or placed on a plane defined by z=min (model z-value). As will be discussed, a reference surface created from a drawing and perpendicular to the drawing plane is positioned such that the subdivision surface easily aligns to the reference surface. Implementations may use any z-value for placement of the virtual drawing plane. However, empirical studies have shown that placement of the virtual drawing plane in the middle of the model makes a reference surface easier to visualize when rotating the model.

Once the virtual drawing plane is positioned, the user may draw a straight line or a multi-segment curve on the virtual drawing plane (step 615), using, by way of non-limiting example, a pointing device such as a mouse or a stylus, or touchscreen technology. Embodiments may automatically draw a straight line after the user initiates such an operation via interaction with a user interface; the straight line is then generated by calculating the best planar fit for the selected vertices (e.g., by executing a least squares regression method). Once an indication is made that the drawing is complete (e.g., by a mouse button or pen-up event) the next step depends whether the drawing is a single-segment or a multi-segment curve. If the drawing is a single-segment curve, process 600 proceeds to step 625; if the drawing is not a single-segment curve, the multi-segment curve is smoothed (step 620). Smoothing may be accomplished via a standard smoothing method. For example, a Bspline or Bezier curve can be calculated from the endpoints of line segments in the drawing or a subset of line segments in the drawing. Smoothing may also be accomplished by applying a least squares smoothing method.

In the next step, a reference surface is created from the single-segment curve or smoothed curve (step 625). In the case of a single-segment curve (i.e., a straight line), the reference surface is a plane (e.g., reference plane 530 illustrated in FIGS. 5*b* and 5*c*); whereas, in the case of a smoothed multi-segment curve, the reference surface is a curved surface (e.g., reference surface 340 illustrated in FIG. 3*b*, or reference surface 440 illustrated in FIGS. 4*a* and 4*b*). To create the reference surface, the single-segment curve or the smoothed curve is extruded by some distance normal to the virtual drawing plane. This distance may be a distance equal to the depth of the model along the normal of the virtual drawing plane, or a distance indicated by the user, for example. Furthermore, the extrusion operation may extrude in two directions to extend over the entire mesh that defines the surface being modified, if for example, the virtual drawing plane is located in the middle of the model as discussed.

Next, the pre-selected entities that correspond to vertices and the vertices of the pre-selected entities that correspond to edges and faces are projected onto the reference surface (step 630). Visually, the operation that projects the vertices may cause the vertices to appear to snap to the reference surface. The vertices may be projected outward from the mesh and along vectors normal to the mesh, outward from the mesh and along vectors normal to the reference surface, onto the reference surface at a location that is the closest distance from the respective vertex, or such that relative spacing between the initial and projected locations of the vertices is maintained (e.g., a same percentage/ratio). If the surface is being reduced, the vertices may be projected inward from the mesh and along vectors normal to the mesh or inward from the mesh and along vectors normal to the reference surface, where an inward direction is toward the center of the surface; see FIG. 3b as an example of a reduction of a surface.

After the vertices are projected, a new mesh is calculated from the positions of the projected vertices on the reference surface and a new model is calculated from the data defining the new mesh (step 635). Process 600 then determines whether to continue to modify the surface or end (step 640), which depends on whether the user wishes to refine the surface or is satisfied with the result, respectively. The user may wish to continue to modify the surface to reach a particular result, whether the particular result was intended prior to beginning process 600 or is a work in progress, in which case, control returns to step 615 as the user draws another curve. Otherwise, process 600 ends (step 645).

Figure 7:
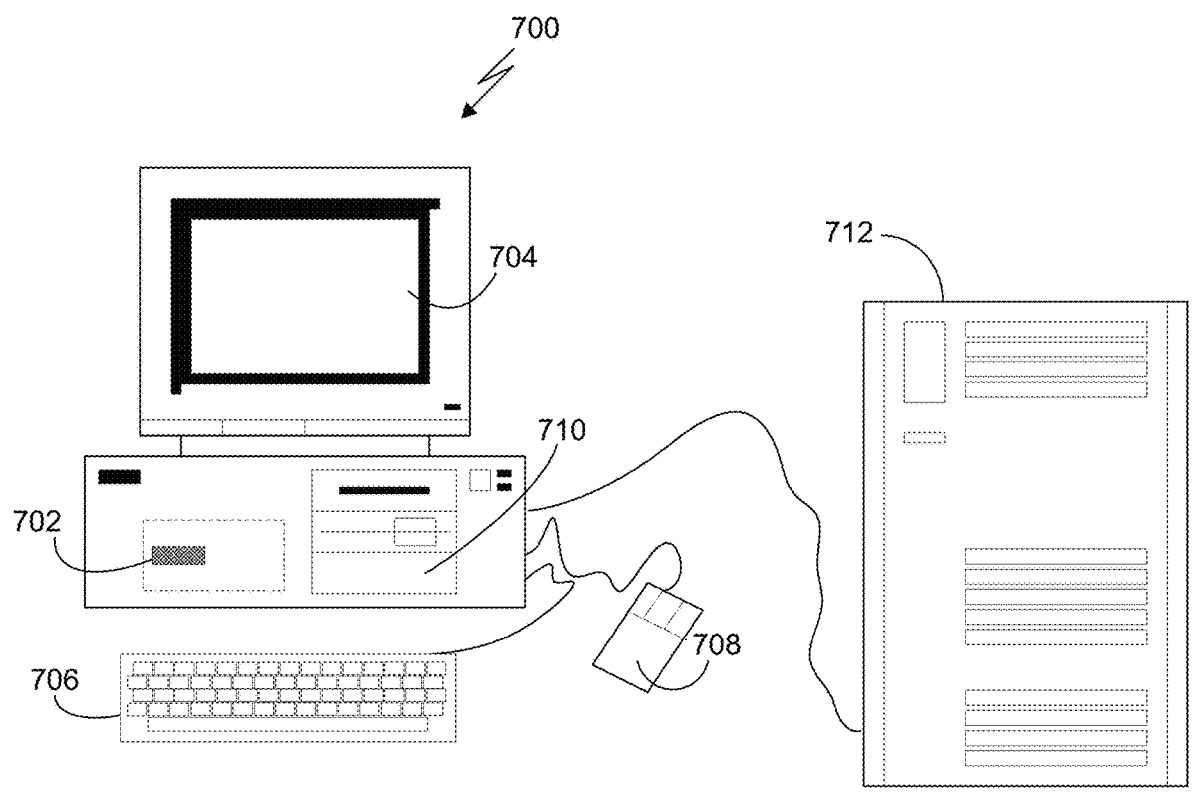
FIG. 7 is a schematic diagram of a computer system in which embodiments of the present invention may be implemented.

FIG. 7 illustrates a computerized modeling system 700 that includes a CPU 702, a computer monitor 704, a keyboard input device 706, a mouse input device 708, and a storage device 710. The CPU 702, computer monitor 704, keyboard 706, mouse 708, and storage device 710 can include commonly available computer hardware devices. For example, the CPU 702 can include an Intel-based processor. The mouse 708 may have conventional left and right buttons that the design engineer may press to issue a command to a software program being executed by the CPU 702. As an alternative or in addition to the mouse 708, the computerized modeling system 700 can include a pointing device such as a mouse, stylus, touch-sensitive pad, or pointing device and buttons built into the keyboard 706. Those of ordinary skill in the art appreciate that the same results described herein with reference to a mouse device can be achieved using another available pointing device. Other appropriate computer hardware platforms are suitable as will become apparent from the discussion that follows. Such computer hardware platforms are preferably capable of operating the Microsoft Windows® 7, UNIX, Linux, or MAC OS operating systems. Mobile devices can also support computerized modeling systems. Such devices are capable of operating the mobile operating systems Android™ and iOS®.

Additional computer processing units and hardware devices (e.g., rapid prototyping, video, and printer devices) may be included in the computerized modeling system 700. Furthermore, the computerized modeling system 700 may include network hardware and software thereby enabling communication to a hardware platform 712, and facilitating communication between numerous computer systems that include a CPU and a storage system, among other computer components.

Computer-aided modeling may be stored on the storage device 710 and loaded into and executed by the CPU 702. The modeling software allows a design engineer to create and modify a 3D model and implements aspects of the invention described herein. The CPU 702 uses the computer monitor 704 to display a 3D model and other aspects thereof as described. Using the keyboard 706 and the mouse 708, the design engineer can enter and modify data associated with the 3D model. The CPU 702 accepts and processes input from the keyboard 706 and mouse 708. The CPU 702 processes the input along with the data associated with the 3D model and makes corresponding and appropriate changes to that which is displayed on the computer monitor 704 as commanded by the modeling software. In one embodiment, the modeling software is based on a solid modeling system that may be used to construct a 3D model consisting of one or more solid and surface bodies.

Embodiments of the present invention may be implemented in digital electronic circuitry, or in computer hardware, firmware, software, or in combinations thereof. Apparatuses may be implemented in a computer program product tangibly embodied in a machine-readable storage device for execution by a programmable processor; and method steps may be performed by a programmable processor executing a program of instructions to perform functions by operating on input data and generating output. Embodiments of the present invention may advantageously be implemented in one or more computer programs that are executable on a programmable system including at least one programmable processor coupled to receive data and instructions from, and to transmit data and instructions to, a data storage system, at least one input device, and at least one output device. Each computer program may be implemented in a high-level procedural or object-oriented programming language, or in assembly or machine language if desired; in any case, the language may be a compiled or interpreted language. Suitable processors include, by way of non-limiting example, both general and special purpose microprocessors. Generally, a processor will receive instructions and data from a read-only memory and/or a random access memory and in some embodiments instructions and data may be downloaded through a global network. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing may be supplemented by, or incorporated in, custom-designed ASICs (application-specific integrated circuits).

Embodiments of the present invention or aspects thereof described herein may be implemented in the form of hardware, firmware, or software. If implemented in software the software may be stored on any non-transient computer readable medium that is configured to enable a processor to load the software or subsets of instructions thereof. The processor then executes the instructions and is configured to operate or cause an apparatus to operate in a manner as described herein.

Although the present invention is described in connection with an exemplary computer system environment, embodiments of the invention are operational with numerous other general purpose or special purpose computer system environments or configurations. The computer system environment is not intended to suggest any limitation as to the scope of use or functionality of any aspect of the invention. Moreover, the computer system environment should not be interpreted as having any dependency or requirement relating to any one or combination of components illustrated in the exemplary operating environment. Examples of computer systems, environments, and/or configurations that may be suitable for use with aspects of the invention include, but are not limited to, personal computers (PCs), server computers, hand-held and laptop devices, multiprocessor systems, microprocessor-based systems, set top boxes, programmable consumer electronics, mobile telephones and mobile operating systems, network PCs, minicomputers, mainframe computers, distributed computing environments that include any of the above systems or devices, and the like. The computer system may have standalone components or workstations, or the computer system may be formed of networked computers by any of known communications networks, processing networks, cloud-based networks, related protocols and the like.

As can be appreciated, the network can be a public network, such as the Internet, or a private network such as an LAN or WAN network, or any combination thereof and can also include PSTN or ISDN sub-networks. The network can also be wired, such as an Ethernet network, or can be wireless such as a cellular network including EDGE, 3G and 4G wireless cellular systems. The wireless network can also be WiFi, Bluetooth, or any other wireless form of communication that is known. Thus, the network is merely exemplary and in no way limits the scope of the present advancements.

The embodiments disclosed herein allow a designer to create a shape of a model by drawing a freeform curve to which the model conforms. As described herein, the present invention provides efficient means for modifying one or more surfaces to reach the desired shape. Advantages of the embodiments disclosed herein include the following: (i) ideas for a design of an object are quickly captured, (ii) multiple curves may be drawn to refine a shape of an object until the desired shape is achieved, where each curve modifies the location of selected vertices of a mesh that is used to calculate a subdivision surface, and (iii) series of different sets of vertices (e.g., rows, columns, and vertices located anywhere on the mesh) may be selected to change the shape of the object at desired locations. Moreover, the present invention eases the burden of deforming control points of a mesh or a freeform surface or body, and enables a design engineer to draw a result to which the surface conforms. No direct manipulation of control points or other surface entities is necessary to revise the shape of a curve and surface. A further advantage is that the present invention bridges the gap between state-of-the-art deformation technologies based on pulling control points and an artist's concept of a shape using a drawing to define that shape. Thus a design engineer may employ natural drawing gestures to generate a surface and thereby design a model.

A number of embodiments of the present invention have been described. Nevertheless, it will be understood by those skilled in the art that various modifications may be made within the boundaries of the invention. For example, embodiments of the present invention may change the order in which operations are performed; such as, step 605 in FIG. 6 may be implemented after steps 610, 615, or 620 in FIG. 6. Furthermore, depending on the needs of an implementation, particular operations described herein may be implemented as a combined operation, eliminated, added to, or otherwise rearranged.

What is claimed is:

1. A computer-implemented method of modifying a shape of a three-dimensional (3D) model, including modifying an underlying surface of the 3D model that defines the shape of the 3D model, the method comprising:
    enabling a user to select a portion of the underlying surface of the 3D model, the selected portion including one or more entities of the underlying surface of the 3D model;
    enabling the user to draw on a computer screen a two-dimensional (2D) outline of a desired shape of the 3D model, wherein the 2D outline is a curve representing a desired profile of the selected portion of the underlying surface of the 3D model;
    in response to the user drawing the curve, automatically modifying the 3D model to conform to the desired shape by:
        creating a reference surface by extruding the drawn curve in at least two directions, wherein:
            if the drawn curve is a straight line, the created reference surface is a plane, and
            if the drawn curve is a multi-segment curve, the created reference surface is a curved surface;
        automatically mapping the selected portion of the underlying surface to the created reference surface by projecting the one or more entities of the underlying surface to respective locations on the created reference surface, the projecting resulting in (i) projected locations on the created reference surface for each of said entities of the underlying surface and (ii) respective projected entities on the created reference surface that are one of: equidistant along the created reference surface, positioned on a vector normal to the underlying surface, positioned on a vector normal to the created reference surface, positioned on a closest location from a respective entity, and positioned with a same relative spacing as the entities on the underlying surface;
    regenerating the 3D model including regenerating the underlying surface using the projected location for each entity to calculate a modified underlying surface, the modified underlying surface conforming to the desired shape, and therefrom the modified underlying surface revising the shape of the 3D model to have the desired shape; and
    displaying the 3D model having the desired shape.

2. The computer-implemented method of claim 1, wherein:
    the outline of the shape is generated on a virtual plane normal to a viewing direction; and
    extruding the curve extrudes the curve in at least one of a positive viewing direction and a negative viewing direction.

3. The computer-implemented method of claim 1, wherein the outline is generated from one of: a user input of the desired shape and an automatic response to user interaction with a user interface.

4. The computer-implemented method of claim 1, wherein the underlying surface is defined as a subdivision surface.

5. The computer-implemented method of claim 1, wherein each of the entities of the selected portion correspond to at least one of a face, an edge, and a vertex of the underlying surface.

6. The computer-implemented method of claim 1, further comprising interactively changing the portion of the underlying surface influenced by the reference surface by one of: excluding one or more of the entities from being projected onto the reference surface and including additional entities to project onto the reference surface.

7. The computer-implemented method of claim 1, wherein at least one of interactively manipulating a user interface handle and interactively selecting at least one entity changes the entities included in the selected portion of the underlying surface.

8. A computer-aided design system comprising:
a processor operatively coupled to a data storage system, the data storage system storing a three-dimensional (3D) model; and
a data storage memory operatively coupled to the processor and comprising instructions to configure the processor to:
enable a user to select a portion of an underlying surface of the 3D model that defines a shape of the 3D model, the selected portion including one or more entities of the underlying surface of the 3D model;
enable the user to draw on a computer screen a curve representing a two-dimensional (2D) outline of a desired shape of the selected portion of the underlying surface of the 3D model;
in response to the user drawing the curve, automatically modify the 3D model to conform to the desired shape, including:
extrude the drawn curve in at least two directions to create a reference surface, wherein:
if the drawn curve is a straight line, the created reference surface is a plane, and
if the drawn curve is a multi-segment curve, the created reference surface is a curved surface;
automatically map the selected portion of the underlying surface to the created reference surface by projecting the selected one or more entities of the underlying surface to respective locations on the created reference surface, the projecting resulting in (i) projected locations on the created reference surface for each of said entities of the underlying surface and (ii) respective projected entities on the created reference surface that are one of: equidistant along the created reference surface, positioned on a vector normal to the underlying surface, positioned on a vector normal to the created reference surface, positioned on a closest location from a respective entity, and positioned with a same relative spacing as the entities on the underlying surface;
regenerate the 3D model including regenerating the underlying surface using the respective locations on the reference surface for the selected one or more entities to calculate a modified underlying surface, the modified underlying surface conforming to the desired shape, and the modified underlying surface revising the shape of the 3D model to the desired shape; and
display the 3D model having the desired shape.

9. The computer-aided design system of claim 8, wherein:
the curve is drawn on a virtual plane normal to a viewing direction; and
the reference surface is created by extruding the curve in at least one of a positive viewing direction and a negative viewing direction.

10. The computer-aided design system of claim 8, wherein the curve is generated from one of a user input of the desired shape of the 3D model and an automatic response to user interaction with a user interface.

11. The computer-aided design system of claim 8, wherein:
the underlying surface is a subdivision surface, and
the selected entities aid in the calculation of the subdivision surface.

12. The computer-aided design system of claim 8, wherein at least one of a plurality of sides and a plurality of corners of the reference surface can be interactively manipulated causing a modification in the underlying surface, the modification resulting from remapping the selected entities onto the reference surface.

13. A non-transitory computer-readable data storage medium comprising instructions causing a computer to:
enable a user to select a portion of an underlying surface of a three-dimensional (3D) model that defines a shape of the 3D model, the selected portion including one or more entities of the underlying surface of the 3D model;
enable the user to draw on a computer screen a curve representing a two-dimensional (2D) outline of a desired shape of the selected portion of the underlying surface of the 3D model;
in response to the user drawing the curve, automatically modify the 3D model to conform to the desired shape, including:
extrude the drawn curve in at least two directions to create a reference surface, wherein:
if the drawn curve is a straight line, the created reference surface is a plane, and
if the drawn curve is a multi-segment curve, the created reference surface is a curved surface;
automatically map the selected portion of the underlying surface to the created reference surface by projecting the selected one or more entities of the underlying surface to respective locations on the created reference surface, the projecting resulting in (i) projected locations on the created reference surface for each of said entities of the underlying surface and (ii) respective projected entities on the created reference surface that are one of: equidistant along the created reference surface, positioned on a vector normal to the underlying surface, positioned on a vector normal to the created reference surface, positioned on a closest location from a respective entity, and positioned with a same relative spacing as the entities on the underlying surface;
regenerate the 3D model including regenerating the underlying surface using the respective locations on the reference surface for the selected one or more entities to calculate a modified underlying surface, the modified underlying surface conforming to the desired shape, and the modified underlying surface revising the shape of the 3D model to be the desired shape; and
display the 3D model having the desired shape.

14. The data storage medium of claim 13, wherein:
the curve is drawn on a virtual plane normal to a viewing direction; and
the reference surface is created by extruding the curve in at least one of a positive viewing direction and a negative viewing direction.

15. The data storage medium of claim 13, wherein the curve is generated from one of: a user input of the desired shape of the 3D model and an automatic response to user interaction with a user interface.

16. The data storage medium of claim 13, wherein:
the underlying surface is a subdivision surface, and
the selected entities aid in the calculation of the subdivision surface.

17. The data storage medium of claim 13, wherein at least one of the sides and the corners of the reference surface can be interactively manipulated causing a modification in the underlying surface, the modification resulting from remapping the selected entities onto the reference surface.

18. The data storage medium of claim 13, further comprising instructions to cause the computer to, in response to user interaction, change the portion of the underlying surface influenced by the reference surface by one of: excluding one or more of the entities from being projected onto the reference surface, and including additional entities to project onto the reference surface.

* * * * *